United States Patent
Sakurada et al.

(10) Patent No.: US 8,328,893 B2
(45) Date of Patent: Dec. 11, 2012

(54) METHOD OF PRODUCING OXIDE PARTICLES, SLURRY, POLISHING SLURRY, AND METHOD OF POLISHING SUBSTRATE

(75) Inventors: Takafumi Sakurada, Hitachi (JP); Daisuke Hosaka, Hitachi (JP); Kanshi Chinone, Mito (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 151 days.

(21) Appl. No.: 12/226,545

(22) PCT Filed: Apr. 20, 2007

(86) PCT No.: PCT/JP2007/058629
§ 371 (c)(1),
(2), (4) Date: Oct. 21, 2008

(87) PCT Pub. No.: WO2007/123203
PCT Pub. Date: Nov. 1, 2007

(65) Prior Publication Data
US 2009/0165396 A1    Jul. 2, 2009

(30) Foreign Application Priority Data

Apr. 21, 2006  (JP) .............................. P2006-117772
Jun. 16, 2006  (JP) .............................. P2006-167283

(51) Int. Cl.
*B24D 99/00*      (2010.01)
*C01B 13/18*      (2006.01)
*C01F 17/00*      (2006.01)
*C07C 51/41*      (2006.01)
*C09C 1/68*       (2006.01)
*C09K 3/14*       (2006.01)

(52) U.S. Cl. ........ 51/309; 51/307; 423/21.1; 423/592.1; 562/400

(58) Field of Classification Search .................... 51/309; 423/21.1
See application file for complete search history.

(56) References Cited

U.S. PATENT DOCUMENTS
5,759,917 A    6/1998   Grover et al.
(Continued)

FOREIGN PATENT DOCUMENTS
JP       09-188516       7/1997
(Continued)

OTHER PUBLICATIONS

Zheng et al., The Preparation of a Nano-Composite Oxide Solid Solution of Cerium and Zirconium by Solid State Reaction, Jul. 2005, New Chemical Materials, vol. 33, No. 7, pp. 24-26.*

(Continued)

*Primary Examiner* — Roy King
*Assistant Examiner* — Jared Wood
(74) *Attorney, Agent, or Firm* — Antonelli, Terry, Stout & Kraus, LLP.

(57) ABSTRACT

The present invention provides a method of producing oxide particles, comprising a step of mixing a metal carbonate with an acid to give a mixture, a step of heating the mixture to give a metal oxide and a step of pulverizing the metal oxide, and slurry wherein metal oxide particles obtained by the above method of producing are dispersed in an aqueous medium, a polishing slurry, and a method of polishing a substrate. Particularly, the present invention provides a polishing slurry containing cerium oxide particles obtained by using cerium carbonate as the metal carbonate material and oxalic acid as the acid.
The present invention provides a method of producing oxide particles, wherein coarse particle- and abrasion powder-free fine particles can be rapidly obtained. The present invention also provides a polishing slurry using the oxide particles, which can maintain a suitable polishing rate, can reduce generation of scratches, and can accurately polish the surface of a semiconductor.

46 Claims, 6 Drawing Sheets

U.S. PATENT DOCUMENTS

| | | | |
|---|---|---|---|
| 6,562,092 B1 * | 5/2003 | Ito et al. | 51/309 |
| 6,863,700 B2 * | 3/2005 | Yoshida et al. | 51/309 |
| 2001/0004855 A1 * | 6/2001 | Fukuda et al. | 75/255 |
| 2003/0092265 A1 * | 5/2003 | Kim et al. | 438/689 |
| 2003/0170991 A1 * | 9/2003 | Wang et al. | 438/692 |

FOREIGN PATENT DOCUMENTS

| | | |
|---|---|---|
| JP | 2000-186277 | 7/2000 |
| JP | 2002-309236 | 10/2002 |
| JP | 2004-107186 | 4/2004 |
| JP | 2005-126253 | 5/2005 |
| WO | WO 2005/017989 | 2/2005 |

OTHER PUBLICATIONS

Wiliams, pKa Data, http://research.chem.psu.edu/brpgroup/pKa_compilation.pdf.*

Riemenschneider, W. and Tanifuji, M. 2000. Oxalic Acid. Ullmann's Encyclopedia of Industrial Chemistry.*

Chinese Official Action issued on Mar. 11, 2010, for Application No. 200780014174.1.

Z. Yuying, et al., "The preparation of nano-composite oxide solid solution of cerium and zirconium by solid state reaction", *New Chemical Materials*, vol. 33, No. 7, Jul. 2005, pp. 24-26.

Transmittal of Translation of the Preliminary Report on Patentability mailed Nov. 27, 2008, for Application No. PCT/JP2007/058629.

Taiwanese Official Action dated Mar. 21, 2011, for TW Application No. 10020232000.

Chinese Official Action dated Oct. 25, 2011, for CN Application No. 200780014174.1.

* cited by examiner

METHOD OF PRODUCING OXIDE PARTICLES, SLURRY, POLISHING SLURRY, AND METHOD OF POLISHING SUBSTRATE

TECHNICAL FIELD

The present invention relates to a method of producing oxide particles, slurry and polishing slurry obtained by the method, and a method of polishing a substrate.

BACKGROUND ART

Fine particles of metal oxides have been used in various applications. For example, cerium oxide is used a material of a polishing slurry, a catalyst, an ultraviolet screening agent or the like, cobalt oxide as a material of a capacitor, a varistor, a secondary cell or the like, nickel oxide as a material of ferrite or the like, and titanium oxide as a material of a photocatalyst, a pigment or the like.

Particularly, fine particles of cerium oxide are rapidly spreading as an abrasive for precision polishing of semiconductor integrated circuits. The average size of such fine particles of cerium oxide used as an abrasive for precision polishing is generally in the range of several nanometers to several hundreds nanometers. Various methods have been proposed to obtain such fine particles of cerium oxide.

First, ammonium carbonate or ammonium hydrogencarbonate is added to a cerium salt solution such as an aqueous solution of cerium nitrate, to yield cerium carbonate precipitates. Then, the precipitates are washed, filtered, dried and heated to give cerium oxide. The heating temperature should be 400° C. or more to thermally decompose cerium carbonate. The size of the cerium oxide particles thus obtained is not significantly different from the size of the cerium carbonate particles. For example, when cerium carbonate in the form of a plate crystal aggregate having an average particle diameter of several tens nanometers is heated at 700° C., cerium oxide particles in the form of a plate crystal aggregate having an average particle diameter of several tens nanometers are obtained. Then, the resulting cerium oxide is dry-milled with a jet mill or wet-milled with a bead mill, to make it particles microparticulated in the range of several nanometers to several hundreds nanometers.

In this method, however, considerable labor is required for milling, and coarse cerium oxide particles may remain depending on the capability of the mill. When milling is continued for a long time, parts of the mill may be worn to increase the possibility of contamination of the resulting polishing slurry with abrasion powder. Coarse cerium oxide particles and abrasion powder are not preferable because they cause polishing scratches.

There is also a method of obtaining precipitates of cerium oxalate by adding oxalic acid to a cerium salt solution such as an aqueous solution of cerium nitrate. In this method, cerium oxalate is also heated to give cerium oxide which is then microparticulated by milling, so there is a possibility of generation of polishing scratches for the same reason as described above.

There is also a method which comprises optimizing the concentration and reaction temperature of an aqueous solution of cerium nitrate and an aqueous solution of ammonium hydrogen carbonate to form fine precipitates of cerium carbonate and heating the precipitates, whereby spherical cerium oxide having an average particle diameter of 50 nm or less is obtained without milling (see Japanese Patent Application Laid-Open No. 2004-107186). In this method, however, the precipitates are so fine as to easily retain ammonium, thus requiring long time for washing. In addition, the precipitates are so fine as to easily retain water as well, thus requiring long time for drying too. When the heating time is high, the cerium oxide particles are so fine that a part of them may be calcinated to form coarse cerium oxide particles.

There is also a method which comprises heating cerium carbonate in water to give fine precipitates of cerium monooxycarbonate, filtering the precipitates and drying them at 300° C. or more, followed by milling to give cerium oxide particles free of coarse particles (see Japanese Patent Application Laid-Open No. 2005-126253). In this method, however, the step of heating cerium carbonate in water is 2 to 48 hours, and the step of precipitating cerium monooxycarbonate is 5 to 96 hours, and thus the treatment requires a long time.

DISCLOSURE OF INVENTION

As described above, fine particles of cerium oxide obtained by the conventional production methods may contain coarse particles or may be contaminated with abrasion powder from a grinding machine. The method of producing fine particles free of coarse particles is also reported, but there is a difficulty in necessity for a long time in production.

In view of the problems described above, the present invention provides a method of producing oxide particles, wherein fine particles not containing coarse particles or abrasion powder can be rapidly obtained. The present invention also provides a polishing slurry using the oxide particles, which can maintain a suitable polishing rate, can reduce generation of scratches, and can accurately polish the surface of a semiconductor.

The present invention was made by finding that the shape of an oxide obtained by heating a carbonate to which an acid was added, as compared with an oxide obtained by heating a carbonate as it is, is significantly changed.

The present invention relates to the following items.

(1) A method of producing oxide particles, comprising:
a step of mixing a metal carbonate with an acid to give a mixture,
a step of heating the mixture to give a metal oxide, and a step of pulverizing the metal oxide.

(2) The method of producing oxide particles according to the above item (1), wherein the metal carbonate is cerium carbonate.

(3) The method of producing oxide particles according to the above item (1) or (2), wherein the acid is solid at 25° C.

(4) The method of producing oxide particles according to the above item (3), wherein the acid is powdery at 25° C.

(5) The method of producing oxide particles according to any one of the above items (1) to (4), wherein the acid is an organic acid.

(6) The method of producing oxide particles according to the above item (5), wherein the organic acid is composed of a carbon atom, an oxygen atom and a hydrogen atom.

(7) The method of producing oxide particles according to the above item (5) or (6), wherein the acid dissociation constant pKa of the organic acid is lower than the acid dissociation constant $pKa_1$ of carbonic acid.

(8) The method of producing oxide particles according to the above item (7), wherein the acid dissociation constant pKa of the organic acid is 6 or less.

(9) The method of producing oxide particles according to any one of the above items (5) to (8), wherein the organic acid is at least one member selected from succinic acid, malonic acid, citric acid, tartaric acid, malic acid, oxalic acid, maleic acid, adipic acid, salicylic acid, benzoic acid, phthalic acid, glycolic acid, ascorbic acid, and isomers, polymers and copolymers thereof, polyacrylic acid, and polymethacrylic acid.

(10) The method of producing oxide particles according to any one of the above items (5) to (9), wherein the metal carbonate is cerium carbonate, the organic acid is oxalic acid, and the mixing molar ratio of oxalic acid to cerium carbonate is 0.5 to 6.

(11) Slurry wherein metal oxide particles obtained by the method of producing oxide particles according to any one of the above items (1) to (10) are dispersed in an aqueous medium.

(12) A polishing slurry wherein cerium oxide particles obtained by the method of producing oxide particles according to any one of the above items (1) to (10) wherein the metal is cerium and the acid is oxalic acid are dispersed in an aqueous medium.

(13) A polishing slurry wherein particles prepared by pulverizing cerium oxide obtained by heating a mixture of cerium carbonate and oxalic acid are contained in an aqueous medium.

(14) The polishing slurry according to the above item (12) or (13), wherein the median value of the cerium oxide particle diameter is 100 to 2000 nm.

(15) The polishing slurry according to the above item (14), wherein the content of cerium oxide particles having a particle diameter of 3 μm or more is 500 ppm or less based on the total solid content.

(16) The polishing slurry according to the above item (14) or (15), which further comprises a dispersant.

(17) The polishing slurry according to any one of the above items (14) to (16), wherein 99% by volume of the cerium oxide particles have a particle diameter of 1.0 μm or less.

(18) A method of polishing a predetermined substrate with the polishing slurry according to any one of the above items (12) to (17).

(19) The method of polishing a substrate according to the above item (18), wherein the predetermined substrate is a semiconductor substrate having at least a silicon oxide film formed thereon.

The disclosure of this application is related to the subject matters described in Japanese Patent Application No. 2006-117772 filed Apr. 21, 2006 and Japanese Patent Application No. 2006-167283 filed Jun. 16, 2006, the disclosures of which are incorporated by reference in their entirety.

BEST MODE FOR CARRYING OUT THE INVENTION

Figure 1:
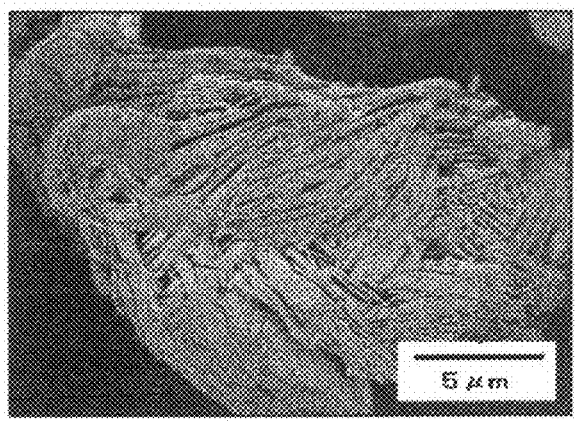
FIG. 1 is a scanning electron micrograph of powder obtained by heating a mixture of cerium carbonate and succinic acid.

The method of producing oxide particles according to the present invention comprises a step of mixing a metal carbonate with an acid to give a mixture, a step of heating the mixture to give a metal oxide, and a step of pulverizing the metal oxide. Generally, when a metal carbonate only is heated, the carbonate is thermally decomposed to give an oxide of the metal. In this case, the carbonate and the oxide are often not significantly different in shape. However, when an acid is mixed with a metal carbonate and the mixture is heated, a chemical reaction occurs between the acid and the metal carbonate, so that the carbonate ion is substituted to form a new metal salt followed by thermal decomposition to give an oxide of the metal. In this case, the carbonate and the oxide are significantly different in shape, and the oxide is an aggregate of fine particles. This oxide is an aggregate of fine particles and can thus be pulverized easily in a short time to form fine oxide particles.

The metal carbonate in the present invention may be not only a carbonate containing one kind of metal element, but also any of double salts consisting of several kinds of metal ions, carbonate ions, and other cations and anions. When a mixtures of these double salts and an acid is heated, carbonate ions in the components of the double salts are substituted to form new metal salts followed by thermal decomposition to give oxides as aggregates of fine particles. For the same reason, the metal carbonates may contain impurities.

The metal that forms the carbonate includes cerium, cobalt, nickel etc. Particularly, when the oxide is used in a polishing slurry as described later, the metal is preferably cerium. The method of producing cerium carbonate is not particularly limited and includes a method wherein an aqueous solution of ammonium hydrogencarbonate is mixed with an aqueous solution of trivalent cerium nitrate to precipitate cerium carbonate which is then filtered and washed. As a matter of course, cerium carbonate may contain other metal carbonates and impurities.

The acid in the present invention is preferably solid at 25° C. It is not preferable that the acid is gaseous, because it is difficult to handle the acid or to mix the acid with the metal carbonate. When the acid is a liquid or in a solution state, its mixture with the metal carbonate becomes liquid so that drying is necessary before the oxide is obtained by heating, and such drying is time-consuming.

The acid in the present invention is preferably powdery from the viewpoint of easy mixing with the metal carbonate. The size of the powder is not particularly limited.

The acid in the present invention is preferably an organic acid. The acid is more preferably a powdery organic acid at 25° C. When an inorganic acid such as nitric acid or sulfuric acid is mixed with the metal carbonate, a chemical reaction is severely caused to rapidly generate carbon dioxide to make the reaction hardly controllable, and a nitrate ion and sulfate ion may, without elimination, remain in the oxide when the heating temperature is low.

The organic acid in the present invention is composed preferably of a carbon atom, oxygen atom and hydrogen atom. In addition to these atoms, a nitrogen atom and sulfur atom may be contained in the organic acid, but will, upon heating, form a nitrate ion and sulfate ion which remain, without elimination, in the oxide when the heating temperature is low.

The acid dissociation constant pKa of the organic acid in the present invention is preferably lower than the first acid dissociation constant $pKa_1$ of carbonic acid. That is, the organic acid in the present invention is preferably a stronger acid than carbonic acid. The pKa of the organic acid is more preferably 6 or less. When there occurs multistage dissociation of the organic acid, the first acid dissociation $pKa_1$ is compared with the $pKa_1$ of carbonic acid. When the organic acid having an acid dissociation constant pKa lower than the acid dissociation constant $pKa_1$ of carbonic acid is mixed with the metal carbonate and then heated, the conjugated base of the organic acid is substituted by a carbonate ion to generate carbon dioxide, thereby forming a metal organic acid salt. When heating is further continued, the metal organic acid salt is thermally decomposed to give an oxide as an aggregate of fine particles. In the present invention, the acid dissociation constant shall be expressed as pKa that is a common logarithm of reciprocal of the actual acid dissociation constant Ka. When there occurs multistage dissociation of the organic acid, the acid dissociation constant in the present invention shall be expressed as the first acid dissociation constant $pKa_1$.

The organic acid in the present invention is preferably at least one member selected from succinic acid, malonic acid, citric acid, tartaric acid, malic acid, oxalic acid, maleic acid, adipic acid, salicylic acid, benzoic acid, phthalic acid, glycolic acid, ascorbic acid, and isomers, polymers and copolymers thereof, polyacrylic acid, and polymethacrylic acid. These organic acids are solid at room temperature and easily available in powdery form. The organic acid is particularly preferably oxalic acid because oxalic acid when calcined in the form of a mixture with cerium carbonate yields cerium oxide in the form of powder to facilitate the pulverizing step.

On the other hand, when a mixture of another organic acid and cerium carbonate is calcined, the resulting cerium oxide may become massive to sometimes make the pulverizing step time-consuming.

Further, the combustion heat of oxalic acid is low, so temperature control is easy during heating.

In addition, the number of carbon atoms in oxalic acid per acid valence is small, so the amount of a global greenhouse gas carbon dioxide generated during combustion is small.

It is preferable that when the acid is mixed for example with cerium carbonate, 1/n to 12/n mole of n-valent acid is mixed with 1 mole of cerium carbonate. When the amount of the acid mixed is small, the reaction may not sufficiently proceed, while when the amount of the acid mixed is large, the acid not participating in the reaction may burn during heating to damage a heating apparatus, and therefore, it is more preferable that 3/n to 9/n mole of n-valent acid is mixed with 1 mole of cerium carbonate.

When cerium carbonate is mixed for example with oxalic acid, the mixing molar ratio of oxalic acid to cerium carbonate is preferably 0.5 to 6, more preferably 3 to 5.

In the present invention, the method of mixing the metal carbonate with the acid is not limited, but when the two are mixed, carbon dioxide may occur depending on the type of acid such as oxalic acid, and therefore, it is preferable to use a method wherein the two are introduced into an open container and stirred therein. The shape of an oxide to be formed will vary depending on the mixing time, but regardless of the mixing time, there can be brought about an effect of easy and rapid pulverization once the two are mixed.

In the case of cerium carbonate for example, the heating temperature in the present invention is preferably 350° C. or more, more preferably 400 to 1000° C.

Because the oxide in the present invention is an aggregate of fine particles and can thus be easily pulverized, the method of pulverizing the same is not limited, but if the average particle diameter should be reduced to several micrometers or less, drymilling with a jet mill or the like, or wet milling in a countercurrent system or with a bead mill, is preferable.

The metal oxide particles obtained in the present invention can be dispersed in an aqueous medium to form slurry. The method of dispersing the oxide particles in an aqueous medium includes dispersing treatment using a homogenizer, an ultrasonic dispersing machine and a wet ball mill in addition to a usual agitator. When a dispersant is used, a polymer dispersant containing ammonium acrylate as a copolymerization component can be used.

The slurry obtained in the present invention can be used as a polishing slurry. Particularly, the polishing slurry containing cerium oxide particles can be used as a polishing slurry for precision polishing of semiconductor integrated circuits. Examples of films polished in semiconductor integrated circuits include a silicon oxide film, a silicon nitride film, and a silicon oxide film doped with boron or phosphorus.

The polishing slurry of the present invention preferably contains cerium oxide particles prepared by pulverizing cerium oxide obtained by calcining a mixture of cerium carbonate and oxalic acid, and water.

The polishing slurry of the present invention is preferably a composition containing a dispersant in addition to the cerium oxide particles and water. For example, the polishing slurry is obtained by dispersing a composition containing the cerium oxide particles prepared by the above-described method and a dispersant in water.

The concentration of the cerium oxide particles is not limited, but is preferably in the range of 0.1 to 20% by weight for easy handling of the polishing slurry in the form of a dispersion.

Because the dispersant is used in polishing of semiconductor elements, it is preferably a dispersant wherein the content of alkali metals such as sodium ion, potassium ion etc. and halogens can be reduced to 10 ppm or less. For example, a polymer dispersant such as ammonium polyacrylate is preferable.

The amount of the dispersant added is preferably in the range of 0.01 to 5.0 parts by weight based on 100 parts by weight of the cerium oxide particles, for the dispersibility of the particles in the polishing slurry, for prevention precipitation thereof, and from the relationship between polishing scratches and the amount of the dispersant added.

The weight-average molecular weight of the dispersant is preferably 100 to 50,000, more preferably 1,000 to 10,000. When the molecular weight of the dispersant is lower than 100, a sufficient polishing rate tends to be hardly attained in polishing of a silicon oxide film or a silicon nitride film, while when the molecular weight of the dispersant is higher than 50,000, the viscosity is increased and the storage stability of the polishing slurry tends to be decreased. In the present invention, the weight-average molecular weight is a standard polystyrene-equivalent molecular weight determined by gel permeation chromatography.

The method of dispersing the cerium oxide particles in water can make use of a homogenizer, an ultrasonic dispersing machine and a wet ball mill in addition to dispersing treatment with a usual agitator.

The second particle diameter of the cerium oxide particles in the polishing slurry prepared in this manner has a particle diameter distribution, so the diameter of 99% (also referred to hereinafter as D99) by volume of the cerium oxide particles is preferably 1.0 μm or less. If the D99 is more than 1.0 μm, many scratches may occur. The D99 is more preferably 0.7 μm or less to reduce scratches.

The median value (also referred to hereinafter as D50) of the secondary particle diameter of the cerium oxide particles in the polishing slurry is preferably 100 nm or more, more preferably 150 nm or more. The median value is preferably 2000 nm or less, more preferably 500 nm or less. When the median value of the secondary particle diameter is less than 100 nm, the polishing rate tends to be reduced, while the median value is more than 2000 nm, polishing scratches tend to occur easily on the surface of a film to be polished. The median value (D50) and the D99 of the secondary particle diameter of the cerium oxide particles in the polishing slurry, can be measured by a light scattering method, for example with a particle diameter distribution analyzer (for instance, Mastersizer Micro Plus manufactured by Malvern Instruments Ltd.).

In the present invention, the content of particles having a particle diameter of 3 μm or more in the polishing slurry is 500 ppm or less based on the total solid content of the polishing slurry. The scratch reducing effect is apparent from this feature. The coarse particles having a particle diameter of 3 μm or more refer to particles captured by filtration with a filter having a pore diameter of 3 μm. The content of particles having a particle diameter of 3 μm or more is more preferably 200 ppm or less based on the total solid content, thereby further increasing the scratch reducing effect, and the content of particles having a particle diameter of 3 μm or more is still more preferably 100 ppm or less based on the total solid content, thereby bringing about the highest scratch reducing effect.

The content of the coarse particles having a diameter of 3 μm or more can be determined by measuring the weight of the particles captured by filtration with a filter having a pore diameter of 3 μm. The total solid content of the polishing slurry is separately determined by measuring the weight of the polishing slurry after drying. For example, 10 g of the polishing slurry is dried at 150° C. for 1 hour and then measured to determine the solid content. Then, the mass of the polishing slurry used in filtration with a filter having a pore diameter of 3 μm is multiplied by the solid content to determine the total solid content of the polishing slurry used.

The means that can be used to reduce the content of coarse particles includes, but is not limited to, filtration and classification.

The polishing slurry of the present invention can also be prepared for example either as a one-pack type polishing slurry composed of cerium oxide particles, a dispersant, an additive such as a polymer, and water, or as a two-liquid type polishing slurry in which cerium oxide slurry consisting of cerium oxide particles, a dispersant and water is separated from an additive liquid consisting of an additive and water. In either case, stable characteristics can be obtained.

When the polishing slurry is stored as a two-liquid type polishing slurry in which the cerium oxide slurry is separated from an additive liquid, its planarization property and polishing rate can be regulated by arbitrarily changing the formulation of the two liquids. When a substrate is polished with the two-liquid type polishing slurry, the additive liquid and the cerium oxide slurry are sent in different lines, and the lines are merged into one to mix the liquids just before the outlet of the feeding line, thereby supplying the mixture onto the polishing platen. Alternatively, the two are mixed previously at an arbitrary ratio in a container and then supplied onto the polishing platen.

The polishing slurry of the present invention can be used in a substrate polishing method of polishing a predetermined substrate. For example, the polishing slurry of the present invention can be used in polishing a film flatly by pressing a substrate having the film to be polished against a polishing cloth and moving the film and the polishing cloth relatively to each other while supplying the polishing slurry to the space between the film to be polished and the polishing cloth.

The substrate includes, for example, a substrate involved in the manufacture of a semiconductor device, specifically a substrate having an inorganic insulating layer formed on a semiconductor substrate in a stage where a circuit element has been formed, and a substrate having an inorganic insulating layer embedded on the substrate in a step of forming a shallow trench device isolation. The inorganic insulating layer that is a film to be polished includes an insulating layer consisting of at least silicon oxide film.

EXAMPLES

Hereinafter, the present invention is described in more detail by reference to the Examples, but the present invention is not limited to these examples. Chemical substances used in the Examples are reagents manufactured by Wako Pure Chemical Industries, Ltd.

Example 1

Preparation of Oxide

As a metal carbonate and an acid, 100 g of cerium carbonate.$8H_2O$ and 52 g of succinic acid were placed in a polyethylene container and mixed for 10 minutes under stirring with a rotating stirring blade at 20 rpm. The mixture was placed in an alumina container and heated at 750 g for hour in air to give about 50 g yellowish-white powder. FIG. 1 is a scanning electron micrograph of the powder thus obtained. The shape of the resulting powder is changed as compared with powder obtained without adding an organic acid in Comparative Example 1. By X-ray diffractometry analysis, this powder was confirmed to be cerium oxide.

(Preparation of Fine Oxide Particles)

40 g of the cerium oxide prepared above in manufacture of the oxide, 1 g of (40 mass %) aqueous solution of ammonium polyacrylate, and 759 g of deionized water were mixed, stirred for 10 minutes, and pulverized for 30 minutes with a countercurrent wet grinding machine MICROFLUIDIZER (produced by MICROFLUIDEX INC.). The average particle diameter of cerium oxide particles in the obtained slurry, as determined by a laser diffraction particle size distribution analyzer (Mastersizer Micro Plus, manufactured by Malvern Instruments Ltd.), was 300 nm. The slurry was dried, and when cerium oxide particles were observed under a scanning electron microscope, coarse particles of 3 μm or more or particles other than cerium oxide considered as abrasion powder were not recognized.

Example 2

Preparation of Oxide

Figure 2:
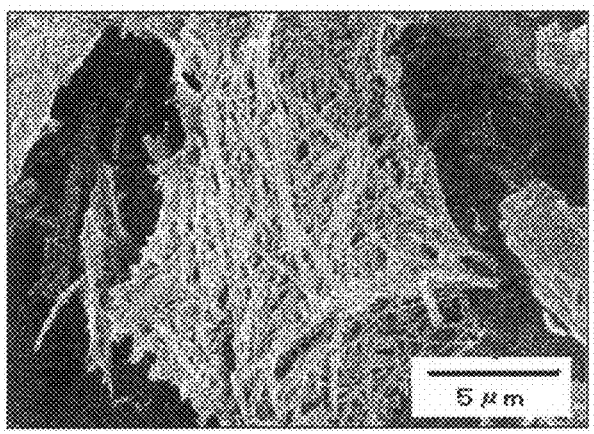
FIG. 2 is a scanning electron micrograph of powder obtained by heating a mixture of cerium carbonate and malonic acid.

About 50 g yellowish-white powder was obtained in the same manner as in Example 1 except that 100 g of cerium carbonate.$8H_2O$ and 45 g of malonic acid were used as the metal carbonate and the acid respectively. FIG. 2 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 230 nm. The slurry was dried, and when cerium oxide particles were observed under a scanning electron microscope, coarse particles of 3 μm or more or particles considered as abrasion powder other than cerium oxide were not recognized.

Example 3

Preparation of Oxide

Figure 3:
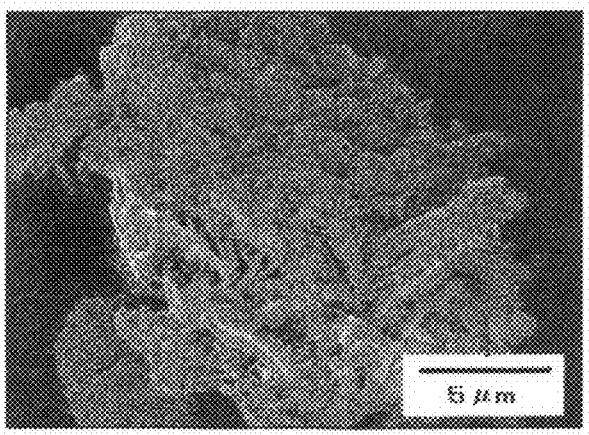
FIG. 3 is a scanning electron micrograph of powder obtained by heating a mixture of cerium carbonate and citric acid.

About 50 g yellowish-white powder was obtained in the same manner as in Example 1 except that 100 g of cerium carbonate.$8H_2O$ and 56 g of citric acid were used. FIG. 3 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 210 nm. The slurry was dried, and when cerium oxide particles were observed under a scanning electron microscope, coarse particles of 3 μm or more or particles considered as abrasion powder other than cerium oxide were not recognized.

Example 4

Preparation of Oxide

Figure 4:
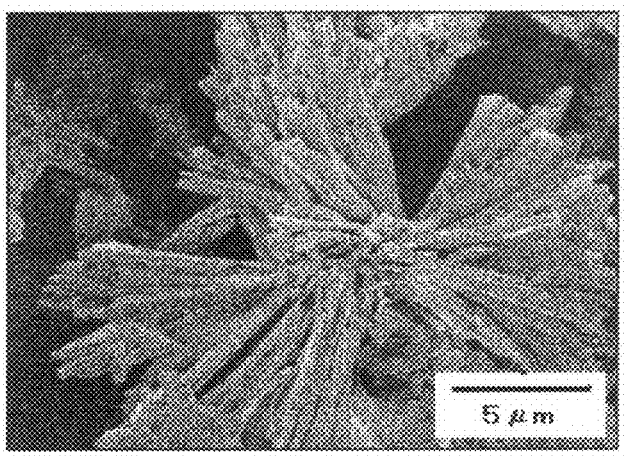
FIG. 4 is a scanning electron micrograph of powder obtained by heating a mixture of cerium carbonate and tartaric acid.

About 50 g yellowish-white powder was obtained in the same manner as in Example 1 except that 100 g of cerium carbonate.$8H_2O$ and 65 g of tartaric acid were used. FIG. 4 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 230 nm. The slurry was dried, and when cerium oxide particles were observed under a scanning electron microscope, coarse particles of 3 μm or more or particles considered as abrasion powder other than cerium oxide were not recognized.

Example 5

Preparation of Oxide

Figure 5:
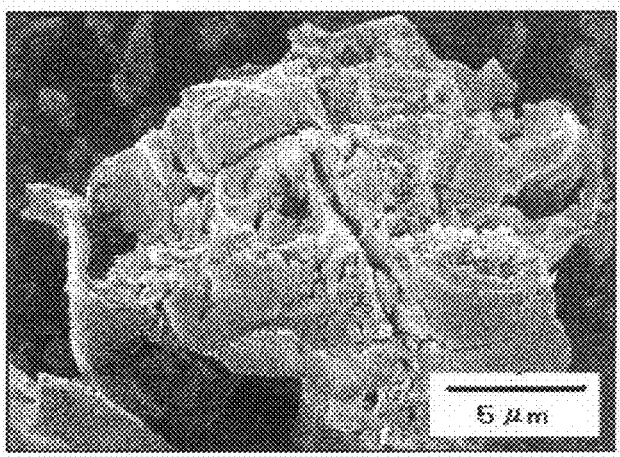
FIG. 5 is a scanning electron micrograph of powder obtained by heating a mixture of cerium carbonate and malic acid.

About 50 g yellowish-white mass was obtained in the same manner as in Example 1 except that 100 g of cerium carbonate.$8H_2O$ and 58 g of malic acid were used. This mass was ground in a mortar. FIG. 5 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 290 nm. The slurry was dried, and when cerium oxide particles were observed under a scanning electron microscope, coarse particles of 3 μm or more or particles considered as abrasion powder other than cerium oxide were not recognized.

Example 6

Preparation of Oxide

Figure 6:
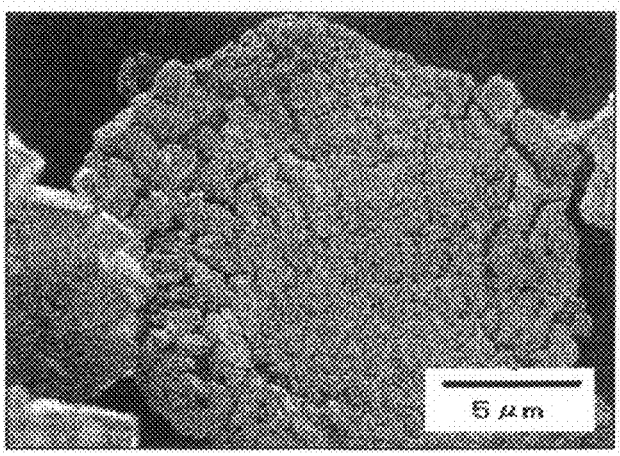
FIG. 6 is a scanning electron micrograph of powder obtained by heating a mixture of cerium carbonate and oxalic acid.

About 50 g yellowish-white powder was obtained in the same manner as in Example 1 except that 100 g of cerium carbonate.$8H_2O$ and 55 g of oxalic acid.$2H_2O$ were used. FIG. 6 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 210 nm. The slurry was dried, and when cerium oxide particles were observed under a scanning electron microscope, coarse particles of 3 μm or more or particles considered as abrasion powder other than cerium oxide were not recognized.

Example 7

Preparation of Oxide

Figure 7:
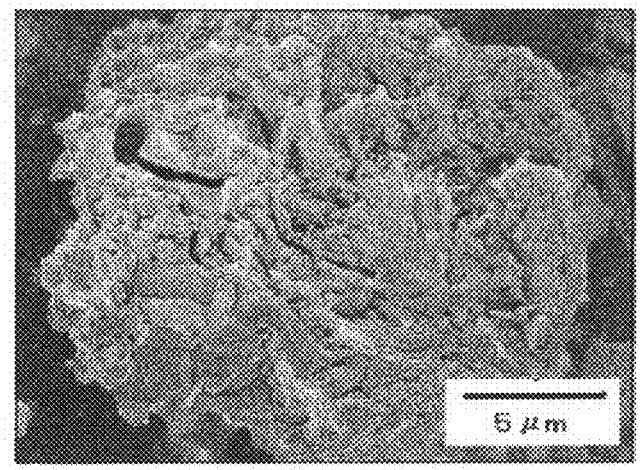
FIG. 7 is a scanning electron micrograph of powder obtained by heating a mixture of cerium carbonate and maleic acid.

About 50 g yellowish-white powder was obtained in the same manner as in Example 1 except that 100 g of cerium carbonate.$8H_2O$ and 51 g of maleic acid were used. FIG. 7 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 280 nm. The slurry was dried, and when cerium oxide particles were observed under a scanning electron microscope, coarse particles of 3 μm or more or particles considered as abrasion powder other than cerium oxide were not recognized.

Example 8

Preparation of Oxide

Figure 8:
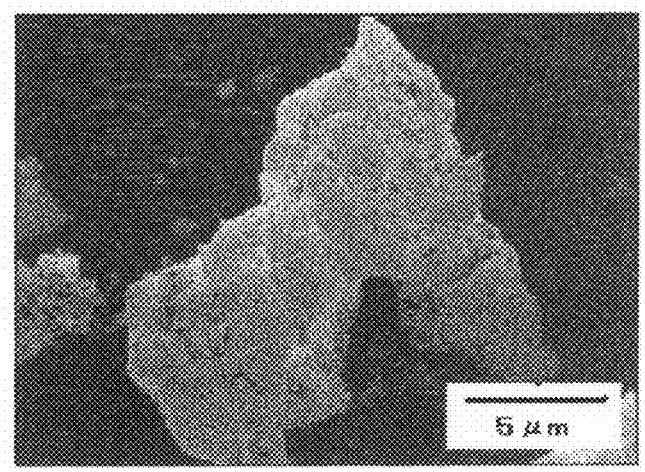
FIG. 8 is a scanning electron micrograph of powder obtained by heating a mixture of cerium carbonate and adipic acid.

About 50 g yellowish-white mass was obtained in the same manner as in Example 1 except that 100 g of cerium carbonate.$8H_2O$ and 64 g of adipic acid were used. This mass was ground in a mortar. FIG. 8 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 280 nm. The slurry was dried, and when cerium oxide particles were observed under a scanning electron microscope, coarse particles of 3 μm or more or particles considered as abrasion powder other than cerium oxide were not recognized.

Example 9

Preparation of Oxide

Figure 9:
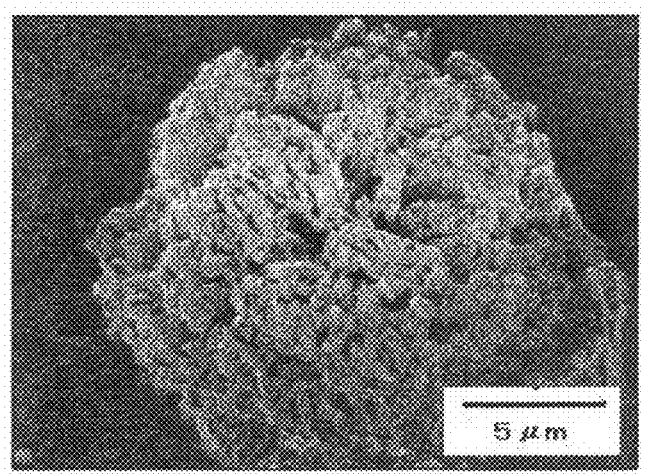
FIG. 9 is a scanning electron micrograph of powder obtained by heating a mixture of cerium carbonate and salicylic acid.

About 50 g yellowish-white powder was obtained in the same manner as in Example 1 except that 100 g of cerium carbonate.$8H_2O$ and 60 g of salicylic acid were used. FIG. 9 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 250 nm. The slurry was dried, and when cerium oxide particles were observed under a scanning electron microscope, coarse particles of 3 μm or more or particles considered as abrasion powder other than cerium oxide were not recognized.

Example 10

Preparation of Oxide

Figure 10:
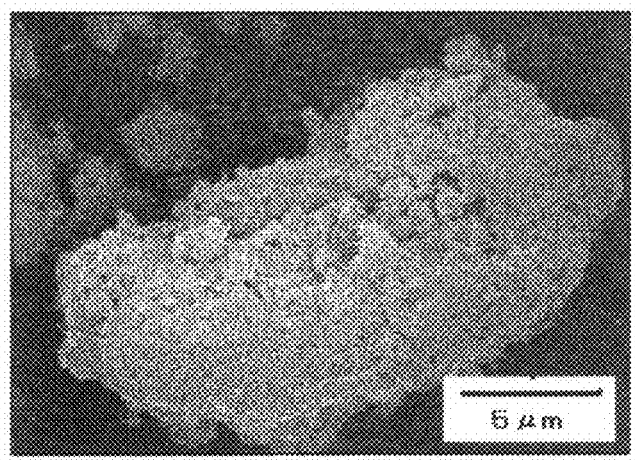
FIG. 10 is a scanning electron micrograph of powder obtained by heating a mixture of cerium carbonate and benzoic acid.

About 50 g yellowish-white powder was obtained in the same manner as in Example 1 except that 100 g of cerium carbonate.$8H_2O$ and 105 g of benzoic acid were used. FIG. 10 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 250 nm. The slurry was dried, and when cerium oxide particles were observed under a scanning electron microscope, coarse particles of 3 μm or more or particles considered as abrasion powder other than cerium oxide were not recognized.

Example 11

Preparation of Oxide

Figure 11:
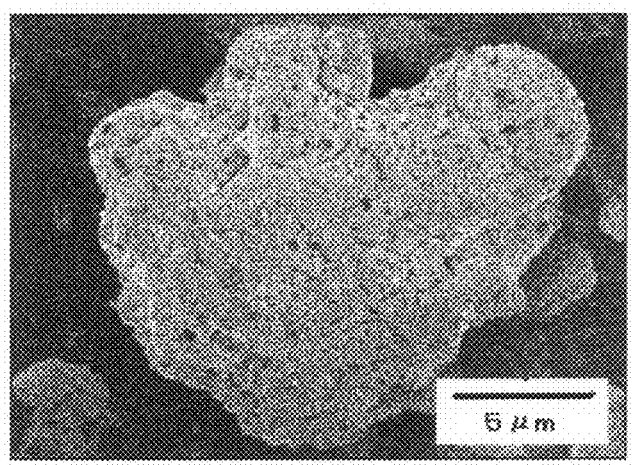
FIG. 11 is a scanning electron micrograph of powder obtained by heating a mixture of cerium carbonate and phthalic acid.

About 50 g yellowish-white powder was obtained in the same manner as in Example 1 except that 100 g of cerium carbonate.$8H_2O$ and 72 g of phthalic acid were used. FIG. 11 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 240 nm. The slurry was dried, and when cerium oxide particles were observed under a scanning electron microscope, coarse particles of 3 μm or more or particles considered as abrasion powder other than cerium oxide were not recognized.

Example 12

Preparation of Oxide

Figure 12:
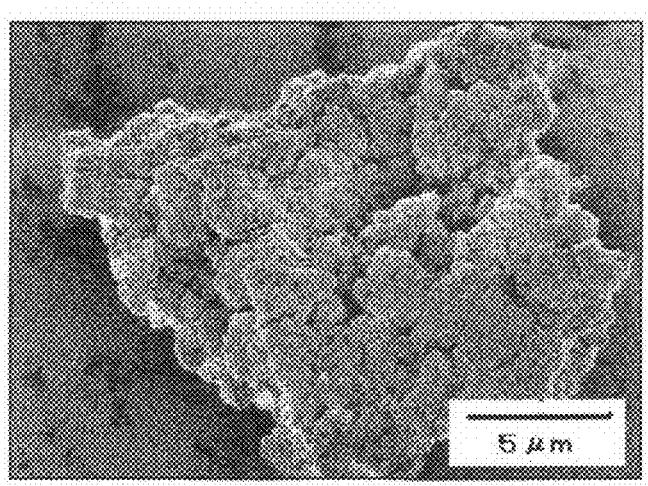
FIG. 12 is a scanning electron micrograph of powder obtained by heating a mixture of cerium carbonate and glycolic acid.

About 50 g yellowish-white powder was obtained in the same manner as in Example 1 except that 100 g of cerium carbonate.$8H_2O$ and 33 g of glycolic acid were used. FIG. 12 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 200 nm. The slurry was dried, and when cerium oxide particles were observed under a scanning electron microscope, coarse particles of 3 μm or more or particles considered as abrasion powder other than cerium oxide were not recognized.

Example 13

Preparation of Oxide

Figure 13:
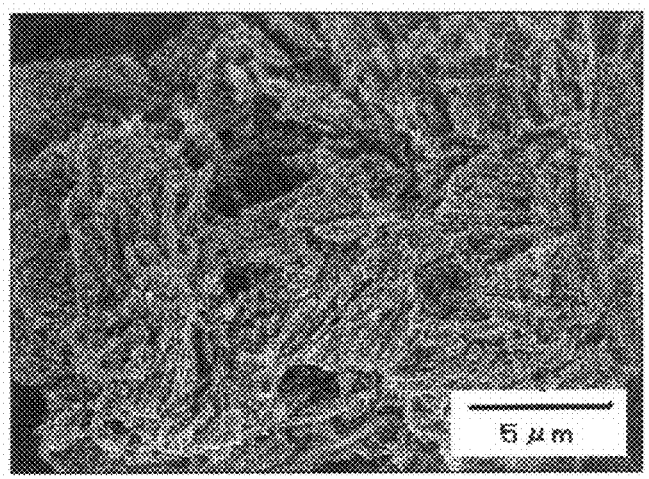
FIG. 13 is a scanning electron micrograph of powder obtained by heating a mixture of cerium carbonate and ascorbic acid.

About 50 g yellowish-white powder was obtained in the same manner as in Example 1 except that 100 g of cerium carbonate.$8H_2O$ and 77 g of ascorbic acid were used. FIG. 13 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 280 nm. The slurry was dried, and when cerium oxide particles were observed under a scanning electron microscope, coarse particles of 3 μm or more or particles considered as abrasion powder other than cerium oxide were not recognized.

Example 14

Preparation of Oxide

Figure 14:
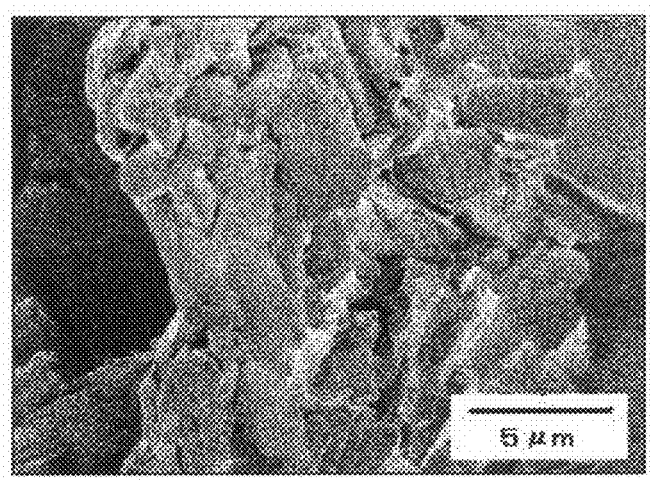
FIG. 14 is a scanning electron micrograph of powder obtained by heating a mixture of cerium carbonate and polyacrylic acid.

About 50 g yellowish-white powder was obtained in the same manner as in Example 1 except that 100 g of cerium carbonate.$8H_2O$ and 63 g of polyacrylic acid having an average molecular weight of 25000 were used. FIG. 14 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 270 nm. The slurry was dried, and when cerium oxide particles were observed under a scanning electron microscope, coarse particles of 3 μm or more or particles considered as abrasion powder other than cerium oxide were not recognized.

Example 15

Preparation of Oxide

About 50 g yellowish-white powder was obtained in the same manner as in Example 1 except that 100 g of cerium carbonate.$8H_2O$ and 75 g of polymethacrylic acid were used.

Figure 15:
FIG. 15 is a scanning electron micrograph of powder obtained by heating a mixture of cerium carbonate and polymethacrylic acid.

FIG. 15 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 290 nm. The slurry was dried, and when cerium oxide particles were observed under a scanning electron microscope, coarse particles of 3 μm or more or particles considered as abrasion powder other than cerium oxide were not recognized.

Example 16

Preparation of Oxide

Figure 16:
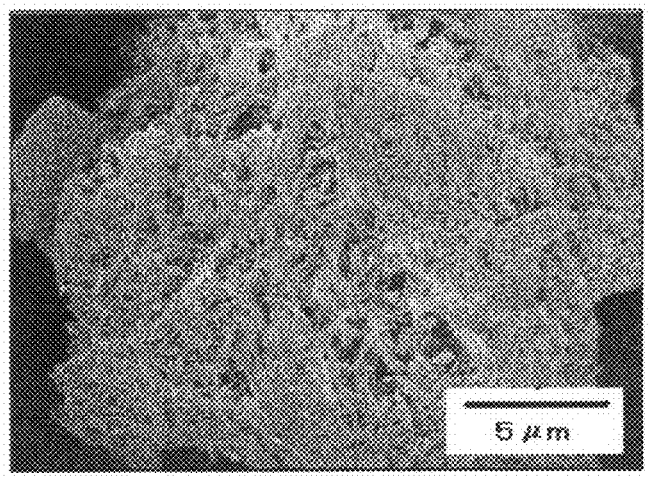
FIG. 16 is a scanning electron micrograph of powder obtained by heating a mixture of cerium carbonate, lanthanum carbonate and malonic acid.

About 50 g yellowish-white powder was obtained in the same manner as in Example 1 except that 90 g of cerium carbonate.8H$_2$O, 10 g of lanthanum carbonate hydrate, and 45 g of malonic acid were used. FIG. 16 is a scanning electron micrograph of the powder thus obtained. By X-ray diffractometry analysis, this powder was confirmed to be a mixture of cerium oxide and lanthanum oxide.

(Preparation of Fine Oxide Particles)

When slurry was prepared in the same manner as in Example 1, the average particle diameter was 220 nm. The slurry was dried, and when cerium oxide and lanthanum oxide particles were observed under a scanning electron microscope, coarse particles of 3 μM or more or particles considered as abrasion powder other than cerium oxide or lanthanum oxide were not recognized.

Comparative Example 1

Preparation of Oxide

Figure 17:
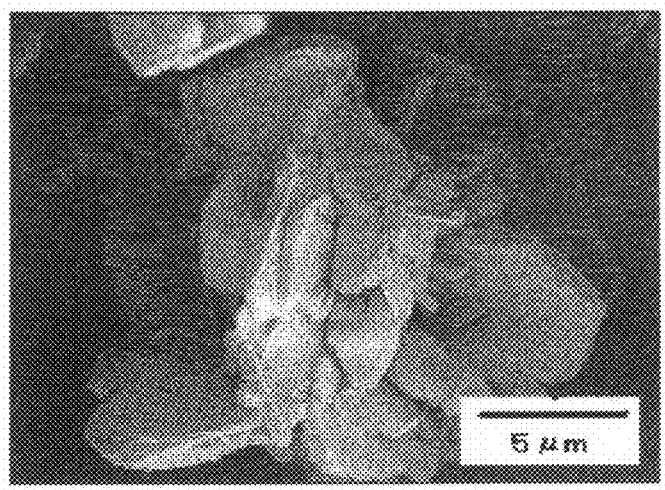
FIG. 17 is a scanning electron micrograph of powder obtained by heating cerium carbonate only.

About 50 g yellowish-white powder was obtained in the same manner as in Example 1 except that 100 g of cerium carbonate.8H$_2$O only was used in the absence of an acid. FIG. 17 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 340 nm. The slurry was dried, and when cerium oxide particles were observed under a scanning electron microscope, coarse particles of 3 μm or more were recognized. When other observed amorphous particles were analyzed by an energy dispersive X-ray element analyzer, the particles were confirmed to be iron-containing particles. Because iron-containing particles could not be confirmed even if the particles before pulverization were analyzed, it is estimated that the iron-containing amorphous particles are derived from abrasion powder other than cerium oxide.

Comparative Example 2

Preparation of Oxide

Figure 18:
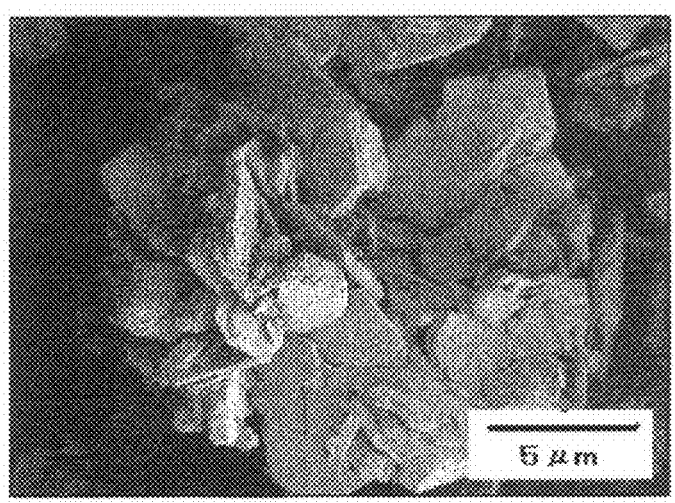
FIG. 18 is a scanning electron micrograph of powder obtained by heating a mixture of cerium carbonate and polyethylene glycol.

About 50 g yellowish-white powder was obtained in the same manner as in Example 1 except that 100 g of cerium carbonate.8H$_2$O and 50 g of polyethylene glycol having an average molecular weight of 400 that is not an acid were used in the absence of an acid. FIG. 18 is a scanning electron micrograph of the powder thus obtained. By X-ray diffractometry analysis, this powder was confirmed to be cerium oxide.

(Preparation of Fine Oxide Particles)

When slurry was prepared in the same manner as in Example 1, the average particle diameter was 340 nm. The slurry was dried, and when cerium oxide particles were observed under a scanning electron microscope and analyzed by the energy dispersive X-ray element analyzer, coarse particles of 3 μm or more and particles considered as abrasion powder other than cerium oxide were recognized similarly to Comparative Example 1.

Example 17

6 kg of commercial cerium carbonate and 3.3 kg of oxalic acid.2H$_2$O were placed in a polyethylene container provided with a gas venting hole, and mixed by shaking for 5 minutes with a shaker. The mixture was introduced into an alumina container and calcined at 800° C. in air for 2 hours to give 3 kg yellowish-white powder. This powder was confirmed to be cerium oxide by phase identification in X-ray diffractometry.

1000 g of the cerium oxide particles obtained above, 80 g of (40 mass %) aqueous solution of ammonium polyacrylate, and 5600 g of deionized water were mixed, stirred for 10 minutes, and wet-milled for 30 minutes with a bead mill (manufactured by Ashizawa Finetec). The resulting dispersion was precipitated by leaving it at room temperature for 20 hours, and its supernatant was collected. The supernatant was filtered with a filter having a pore diameter of 1.0 μm, then filtered again with a filter having a pore diameter of 1.0 μm, and adjusted with deionized water to a solid content of 5% to give a cerium oxide polishing slurry for semiconductor planarization.

When the particle diameter of the resulting cerium oxide polishing slurry for semiconductor planarization was determined by measuring the stock solution of the cerium oxide polishing slurry for semiconductor planarization with a laser diffraction particle size distribution analyzer (Mastersizer Micro Plus manufactured by Malvern Instruments Ltd.; refractive index: 1.9285; light source: He—Ne laser; and absorption: 0), the median value (D50) of the secondary particle diameter was 190 nm and D99 was 0.7 μm.

For examining the content of coarse particles, the resulting cerium oxide polishing slurry for semiconductor planarization was diluted 15-fold, and 30 g of the resulting dilution was filtered through a 3-μm filter (Cyclopore Track Etch Membrane Filter manufactured by Whatman). After filtration, the filter was dried at room temperature, the mass of the filter was measured, and from the difference in the mass of the filter before and after filtration, the amount of coarse particles having a diameter of 3 μm or more was determined. Separately, 10 g of the polishing slurry was dried at 150° C. for 1 hour, and the solid content of the polishing slurry was calculated. As a result, the content (mass ratio) of coarse particles having a diameter of 3 μm or more in the solid of the polishing slurry was 300 ppm.

The cerium oxide polishing slurry for semiconductor planarization was diluted 5-fold with deionized water and used in polishing in the following manner. The polishing rate was 650 nm/min. When the surface of a wafer that had been polished with the polishing slurry was observed under an optical microscope, 20 scratches were observed on the whole area (200 mm) of the wafer.

(Polishing Test Method)

Polishing load: 30 kPa

Polishing pad: Foamed polyurethane resin (IC-1000, manufactured by Rodel Inc.)

Revolution number: platen, 75 min$^{-1}$; pad, 75 min$^{-1}$

Feed speed of polishing slurry: 200 mL/min

Object polished: P-TEOS layered Si wafer (200 mm)

Example 18

1000 g of the cerium oxide particles obtained in Example 17, 80 g of (40 mass %) aqueous solution of ammonium polyacrylate, and 5600 g of deionized water were mixed, stirred for 10 minutes, and wet-milled for 30 minutes with a beadmill (manufactured by Ashizawa Finetec). The resulting dispersion was precipitated by leaving it at room temperature for 100 hours, and its supernatant was collected. The supernatant was filtered with a filter having a pore diameter of 0.7 μm, then filtered again with a filter having a pore diameter of 0.7 μm, and adjusted with deionized water to a solid content of 5% to give a cerium oxide polishing slurry for semiconductor planarization.

When the particle diameter of the resulting cerium oxide polishing slurry for semiconductor planarization was measured in the same manner as in Example 17, the median value (D50) of the secondary particle diameter was 160 nm and D99 was 0.5 μm.

For examining the content of coarse particles in the resulting cerium oxide polishing slurry for semiconductor planarization, the amount of coarse particles having a diameter of 3 μm or more was determined in the same manner as in Example 17 from the difference in the mass of the filter before and after filtration. As a result, the content of coarse particles having a diameter of 3 μm or more in the solid of the polishing slurry was 20 ppm.

The cerium oxide polishing slurry for semiconductor planarization was diluted 5-fold with deionized water and used in polishing in the same polishing test method as in Example 1. The polishing rate was 350 nm/min. When the surface of a wafer that had been polished with the polishing slurry was observed under an optical microscope, 10 scratches were observed on the whole area (200 mm) of the wafer.

Example 19

6 kg of commercial cerium carbonate and 4.9 kg of oxalic acid.$2H_2O$ were placed in a polyethylene container provided with a gas venting hole, and mixed by shaking for 12 hours with a shaker. The mixture was introduced into an alumina container and calcined at 800° C. in air for 2 hours to give 3 kg yellowish-white powder. This powder was confirmed to be cerium oxide by phase identification in X-ray diffractometry.

1000 g of the cerium oxide particles obtained above, 80 g of (40 mass %) aqueous solution of ammonium polyacrylate, and 5600 g of deionized water were mixed, stirred for 10 minutes, and wet-milled for 30 minutes with a bead mill (manufactured by Ashizawa Finetec). The resulting dispersion was precipitated by leaving it at room temperature for 100 hours, and its supernatant was collected. The supernatant was filtered with a filter having a pore diameter of 0.7 μm, then filtered again with a filter having a pore-diameter of 0.7 μm, and adjusted with deionized water to a solid content of 5% to give a cerium oxide polishing slurry for semiconductor planarization.

When the particle diameter of the resulting cerium oxide polishing slurry for semiconductor planarization was measured in the same manner as in Example 17, the median value (D50) of the secondary particle diameter was 160 nm and D99 was 0.5 μm.

For examining the content of coarse particles in the resulting cerium oxide polishing slurry for semiconductor planarization, the amount of coarse particles having a diameter of 3 μm or more was determined in the same manner as in Example 17 from the difference in the mass of the filter before and after filtration. As a result, the content of coarse particles having a diameter of 3 μm or more in the solid of the polishing slurry was 20 ppm.

The cerium oxide polishing slurry for semiconductor planarization was diluted 5-fold with deionized water and used in polishing in the same polishing test method as in Example 17. The polishing rate was 350 nm/min. When the surface of a wafer that had been polished with the polishing slurry was observed under an optical microscope, 10 scratches were observed on the whole area (200 mm) of the wafer.

Example 20

6 kg of commercial cerium carbonate and 2.4 kg of oxalic acid (anhydride) were placed in a polyethylene container provided with a gas venting hole, and mixed by shaking for 5 minutes with a shaker. The mixture was introduced into an alumina container and calcined at 800° C. in air for 2 hours to give 3 kg yellowish-white powder. This powder was confirmed to be cerium oxide by phase identification in X-ray diffractometry.

1000 g of the cerium oxide particles obtained above, 80 g of (40 mass %) aqueous solution of ammonium polyacrylate, and 5600 g of deionized water were mixed, stirred for 10 minutes, and wet-milled for 30 minutes with a bead mill (manufactured by Ashizawa Finetec). The resulting dispersion was precipitated by leaving it at room temperature for 100 hours, and its supernatant was collected. The supernatant was filtered with a filter having a pore diameter of 0.7 μm, then filtered again with a filter having a pore diameter of 0.7 μm, and adjusted with deionized water to a solid content of 5% to give a cerium oxide polishing slurry for semiconductor planarization.

When the particle diameter of the resulting cerium oxide polishing slurry for semiconductor planarization was measured in the same manner as in Example 17, the median value (D50) of the secondary particle diameter was 160 nm and D99 was 0.5 μm.

For examining the content of coarse particles in the resulting cerium oxide polishing slurry for semiconductor planarization, the amount of coarse particles having a diameter of 3 μm or more was determined in the same manner as in Example 17 from the difference in the mass of the filter before and after filtration. As a result, the content of coarse particles having a diameter of 3 μm or more in the solid of the polishing slurry was 20 ppm.

The cerium oxide polishing slurry for semiconductor planarization was diluted 5-fold with deionized water and used in polishing in the same polishing test method as in Example 17. The polishing rate was 350 nm/min. When the surface of a wafer that had been polished with the polishing slurry was observed under an optical microscope, 10 scratches were observed on the whole area (200 mm) of the wafer.

Comparative Example 3

6 kg of commercial cerium carbonate was introduced into an alumina container and calcined at 800° C. in air for 2 hours to give 3 kg yellowish-white powder. This powder was confirmed to be cerium oxide by phase identification in X-ray diffractometry.

In the same manner as in Example 17, 1000 g of the cerium oxide particles obtained above, 80 g of (40 mass %) aqueous solution of ammonium polyacrylate, and 5600 g of deionized water were mixed, stirred for 10 minutes, and wet-milled for 30 minutes with a bead mill (manufactured by Ashizawa Finetec). The resulting dispersion was precipitated by leaving it at room temperature for 20 hours, and its supernatant was collected. The supernatant was filtered with a filter having a pore diameter of 1.0 μm, then filtered again with a filter having a pore diameter of 1.0 μm, and adjusted with deionized water to a solid content of 5% to give a cerium oxide polishing slurry for semiconductor planarization.

When the particle diameter of the resulting cerium oxide polishing slurry for semiconductor planarization was measured in the same manner as in Example 17, the median value (D50) of the secondary particle diameter was 190 nm and D99 was 0.7 μm.

For examining the content of coarse particles in the resulting cerium oxide polishing slurry for semiconductor planarization, the amount of coarse particles having a diameter of 3 μm or more was determined in the same manner as in Example 17 from the difference in the mass of the filter before and after filtration. As a result, the content of coarse particles having a diameter of 3 μm or more in the solid of the polishing slurry was 500 ppm.

The cerium oxide polishing slurry for semiconductor planarization was diluted 5-fold with deionized water and used in polishing in the same polishing test method as in Example 17. The polishing rate was 650 nm/min. When the surface of a wafer that had been polished with the polishing slurry was observed under an optical microscope, 50 scratches were observed on the whole area (200 mm) of the wafer.

Comparative Example 4

In the same manner as in Example 18, 1000 g of the cerium oxide particles obtained in Comparative Example 4, 80 g of (40 mass %) aqueous solution of ammonium polyacrylate, and 5600 g of deionized water were mixed, stirred for 10 minutes, and wet-milled for 30 minutes with a bead mill (manufactured by Ashizawa Finetec). The resulting dispersion was precipitated by leaving it at room temperature for 100 hours, and its supernatant was collected. The supernatant was filtered with a filter having a pore diameter of 0.7 μm, then filtered again with a filter having a pore diameter of 0.7 μm, and adjusted with deionized water to a solid content of 5% to give a cerium oxide polishing slurry for semiconductor planarization.

When the particle diameter of the resulting cerium oxide polishing slurry for semiconductor planarization was measured in the same manner as in Example 17, the median value (D50) of the secondary particle diameter was 160 nm and D99 was 0.5 μm.

For examining the content of coarse particles in the resulting cerium oxide polishing slurry for semiconductor planarization, the amount of coarse particles having a diameter of 3 μm or more was determined in the same manner as in Example 17 from the difference in the mass of the filter before and after filtration. As a result, the content of coarse particles having a diameter of 3 μm or more in the solid of the polishing slurry was 50 ppm.

The cerium oxide polishing slurry for semiconductor planarization was diluted 5-fold with deionized water and used in polishing in the same polishing test method as in Example 17. The polishing rate was 350 nm/min. When the surface of a wafer that had been polished with the polishing slurry was observed under an optical microscope, 15 scratches were observed on the whole area (200 mm) of the wafer.

Comparative Example 5

1000 g of the cerium oxide particles obtained in Comparative Example 3, 80 g of (40 mass %) aqueous solution of ammonium polyacrylate, and 5600 g of deionized water were mixed, stirred for 10 minutes, and wet-milled for 2 hours with a bead mill (manufactured by Ashizawa Finetec). In the same manner as in Example 18, the resulting dispersion was precipitated by leaving it at room temperature for 100 hours, and its supernatant was collected. The supernatant was filtered with a filter having a pore diameter of 0.7 μm, then filtered again with a filter having a pore diameter of 0.7 μm, and adjusted with deionized water to a solid content of 5% to give a cerium oxide polishing slurry for semiconductor planarization.

When the particle diameter of the resulting cerium oxide polishing slurry for semiconductor planarization was measured in the same manner as in Example 17, the median value (D50) of the secondary particle diameter was 160 nm and D99 was 0.5 μm.

For examining the content of coarse particles in the resulting cerium oxide polishing slurry for semiconductor planarization, the amount of coarse particles having a diameter of 3 μm or more was determined in the same manner as in Example 17 from the difference in the mass of the filter before and after filtration. As a result, the content of coarse particles having a diameter of 3 μm or more in the solid of the polishing slurry was 30 ppm.

The cerium oxide polishing slurry for semiconductor planarization was diluted 5-fold with deionized water and used in polishing in the same polishing test method as in Example 17. The polishing rate was 350 nm/min. When the surface of a wafer that had been polished with the polishing slurry was observed under an optical microscope, 30 scratches were observed on the whole area (200 mm) of the wafer.

INDUSTRIAL APPLICABILITY

According to the present invention, there can be provided a method of producing oxide particles, wherein coarse particle- and abrasion powder-free fine particles can be rapidly obtained, as well as slurry obtained by the same. The present invention can also provide a polishing slurry which can maintain a suitable polishing rate, can reduce generation of scratches, and can accurately polish the surface of a semiconductor with excellent planarity in a wiring step, as well as a method of polishing a substrate.

The invention claimed is:

1. A method of producing polishing particles, comprising:
   a step of mixing a metal carbonate with an organic acid to give a mixture, wherein the metal of the metal carbonate consists of cerium or both cerium and lanthanum,
   a step of heating the mixture in a single heating step, so that both the carbonate ion is substituted to form a new metal salt and thermal decomposition of the new metal salt takes place to give a metal oxide of the metal, and
   a step of pulverizing the metal oxide to obtain the polishing particles.

2. The method of producing polishing particles according to claim 1, wherein the metal carbonate is cerium carbonate, and the metal oxide is cerium oxide.

3. The method of producing polishing particles according to claim 1, wherein the organic acid is solid at 25° C.

4. The method of producing polishing particles according to claim 3, wherein the organic acid is powdery at 25° C.

5. The method of producing polishing particles according to claim 1, wherein the organic acid is composed of a carbon atom, an oxygen atom and a hydrogen atom.

6. The method of producing polishing particles according to claim 1, wherein the acid dissociation constant pKa of the organic acid is lower than the acid dissociation constant $pKa_1$ of carbonic acid.

7. The method of producing polishing particles according to claim 6, wherein the acid dissociation constant pKa of the organic acid is 6 or less.

8. The method of producing polishing particles according to claim 1, wherein the organic acid is at least one member selected from the group consisting of succinic acid, malonic acid, citric acid, tartaric acid, malic acid, oxalic acid, maleic acid, adipic acid, salicylic acid, benzoic acid, phthalic acid, glycolic acid, ascorbic acid, and isomers, polymers and copolymers thereof, polyacrylic acid, and polymethacrylic acid.

9. The method of producing polishing particles according to claim 1, wherein the metal carbonate is cerium carbonate, the organic acid is oxalic acid, and the mixing molar ratio of oxalic acid to cerium carbonate is 0.5 to 6.

10. The method of producing polishing particles according to claim 1, wherein in the step of heating, a chemical reaction occurs between the organic acid and the metal carbonate, so that a substitution is made for the carbonate ion to form a new metal salt followed by thermal decomposition to give the metal oxide.

11. The method of producing polishing particles according to claim 1, wherein the metal oxide formed is an aggregate of fine particles.

12. The method of producing polishing particles according to claim 1, wherein the metal carbonate and the metal oxide are different in shape.

13. The method of producing polishing particles according to claim 1, wherein the metal consists of both cerium and lanthanum.

14. A method of producing a slurry, comprising:
a step of mixing a metal carbonate with an organic acid to give a mixture, wherein the metal of the metal carbonate consists of cerium or both cerium and lanthanum,
a step of heating the mixture in a single heating step, so that both the carbonate ion is substituted to form a new metal salt and thermal decomposition of the new metal salt takes place to give a metal oxide of the metal,
a step of pulverizing the metal oxide, and
a step of dispersing the pulverized metal oxide in an aqueous medium.

15. The method of producing a slurry according to claim 14, wherein the organic acid is solid at 25° C.

16. The method of producing a slurry according to claim 15, wherein the organic acid is powdery at 25° C.

17. The method of producing a slurry according to claim 14, wherein the organic acid is composed of a carbon atom, an oxygen atom and a hydrogen atom.

18. The method of producing a slurry according to claim 14, wherein the acid dissociation constant pKa of the organic acid is lower than the acid dissociation constant $pKa_1$ of carbonic acid.

19. The method of producing a slurry according to claim 14, wherein the acid dissociation constant pKa of the organic acid is 6 or less.

20. The method of producing a slurry according to claim 14, wherein the organic acid is at least one member selected from the group consisting of succinic acid, malonic acid, citric acid, tartaric acid, malic acid, oxalic acid, maleic acid, adipic acid, salicylic acid, benzoic acid, phthalic acid, glycolic acid, ascorbic acid, and isomers, polymers and copolymers thereof, polyacrylic acid, and polymethacrylic acid.

21. The method of producing a slurry according to claim 14, wherein the metal carbonate is cerium carbonate, and the metal oxide is cerium oxide.

22. The method of producing a slurry according to claim 21, wherein the step of pulverizing is executed so that a median value of the cerium oxide particle diameter is 100 to 2000 nm.

23. The method of producing a slurry according to claim 21, wherein the step of pulverizing is executed so that a content of cerium oxide particles having a particle diameter of 3 µm or more is 500 ppm or less based on the total solid content.

24. The method of producing a slurry according to claim 21, wherein the step of pulverizing is executed so that 99% by volume of the cerium oxide particles have a particle diameter of 1.0 µm or less.

25. The method of producing a slurry according to claim 21, wherein the organic acid is oxalic acid.

26. The method of producing a slurry according to claim 25, wherein the mixing molar ratio of oxalic acid to cerium carbonate is 0.5 to 6.

27. The method of producing a slurry according to claim 14, which further comprises adding a dispersant to the aqueous medium.

28. The method of producing a slurry according to claim 14, wherein in the step of heating, a chemical reaction occurs between the organic acid and the metal carbonate, so that a substitution is made for the carbonate ion to form a new metal salt followed by thermal decomposition to give the metal oxide.

29. The method of producing a slurry according to claim 14, wherein the metal consists of both cerium and lanthanum.

30. A method of producing a polishing slurry, comprising:
a step of mixing a metal carbonate with an organic acid to give a mixture, wherein the metal of the metal carbonate consists of cerium or both cerium and lanthanum,
a step of heating the mixture in a single heating step, so that both the carbonate ion is substituted to form a new metal salt and thermal decomposition of the new metal salt takes place to give a metal oxide of the metal,
a step of pulverizing the metal oxide,
a step of dispersing the pulverized metal oxide in an aqueous medium to give a slurry, and
a step of adding an additive liquid to the slurry.

31. The method of producing a polishing slurry according to claim 30, wherein the organic acid is solid at 25° C.

32. The method of producing a polishing slurry according to claim 31, wherein the organic acid is powdery at 25° C.

33. The method of producing a polishing slurry according to claim 30, wherein the organic acid is composed of a carbon atom, an oxygen atom and a hydrogen atom.

34. The method of producing a polishing slurry according to claim 30, wherein the acid dissociation constant pKa of the organic acid is lower than the acid dissociation constant $pKa_1$ of carbonic acid.

35. The method of producing a polishing slurry according to claim 30, wherein the acid dissociation constant pKa of the organic acid is 6 or less.

36. The method of producing a polishing slurry according to claim 30, wherein the organic acid is at least one member selected from the group consisting of succinic acid, malonic acid, citric acid, tartaric acid, malic acid, oxalic acid, maleic acid, adipic acid, salicylic acid, benzoic acid, phthalic acid, glycolic acid, ascorbic acid, and isomers, polymers and copolymers thereof, polyacrylic acid, and polymethacrylic acid.

37. The method of producing a polishing slurry according to claim 30, wherein the metal carbonate is cerium carbonate, and the metal oxide is cerium oxide.

38. The method of producing a polishing slurry according to claim 37, wherein the step of pulverizing is executed so that a median value of the cerium oxide particle diameter is 100 to 2000 nm.

39. The method of producing a polishing slurry according to claim 37, wherein the step of pulverizing is executed so that a content of cerium oxide particles having a particle diameter of 3 μm or more is 500 ppm or less based on the total solid content.

40. The method of producing a polishing slurry according to claim 37, wherein the step of pulverizing is executed so that 99% by volume of the cerium oxide particles have a particle diameter of 1.0 μm or less.

41. The method of producing a polishing slurry according to claim 37, wherein the organic acid is oxalic acid.

42. The method of producing a polishing slurry according to claim 41, wherein a mixing molar ratio of oxalic acid to cerium carbonate is 0.5 to 6.

43. The method of producing a polishing slurry according to claim 30, which further comprises adding a dispersant to the aqueous medium.

44. The method of producing a polishing slurry according to claim 30, comprising:
- a step of preparing a cerium oxide slurry comprising cerium oxide particles, a dispersant and water, and an additive liquid comprising an additive and water, separately, and
- a step of mixing the cerium oxide slurry and the additive liquid.

45. The method of producing a polishing slurry according to claim 30, wherein in the step of heating, a chemical reaction occurs between the organic acid and the metal carbonate, so that a substitution is made for the carbonate ion to form a new metal salt followed by thermal decomposition to give the metal oxide.

46. The method of producing a polishing slurry according to claim 30, wherein the metal consists of both cerium and lanthanum.

* * * * *